United States Patent [19]

Philipp

[11] 4,360,564
[45] Nov. 23, 1982

[54] THIN FILMS OF LOW RESISTANCE AND HIGH COEFFICIENTS OF TRANSMISSION IN THE VISIBLE SPECTRUM

[75] Inventor: Herbert R. Philipp, Scotia, N.Y.

[73] Assignee: General Electric Company, Schenectady, N.Y.

[21] Appl. No.: 229,352

[22] Filed: Jan. 29, 1981

[51] Int. Cl.³ .................. B32B 15/04; H01J 40/14
[52] U.S. Cl. .................. 428/336; 250/209; 250/211 R; 357/4; 428/457; 428/688; 428/689; 428/697; 428/702
[58] Field of Search .......... 250/209, 211 R; 357/4; 428/446, 450, 457, 469, 606, 607, 620, 672, 702, 688, 689, 697, 336; 427/79, 88, 90, 93, 126.1

[56] References Cited

U.S. PATENT DOCUMENTS

| | | | |
|---|---|---|---|
| 3,830,657 | 8/1974 | Farrar | 427/90 |
| 3,988,613 | 10/1976 | Brown et al. | 250/209 X |
| 4,179,534 | 12/1979 | Chang et al. | 427/90 X |
| 4,252,862 | 2/1981 | Nishida | 428/672 X |
| 4,262,054 | 4/1981 | Umezaki et al. | 428/469 X |

OTHER PUBLICATIONS

J. P. Jan and W. B. Pearson; Phil. Mag., 8, 279, (1963), Electrical Properties of $AuAl_2$, $AuGa_2$ and $AuIn_2$.
S. S. Vishnubhata & J. P. Jan, Phil. Mag. 16, 45, (1967), Optical Properties of the Intermetallic Compounds $AuAl_2$, $AuGa_2$, and $AuIn_2$.

Primary Examiner—Thomas J. Herbert, Jr.
Attorney, Agent, or Firm—Julius J. Zaskalicky; James C. Davis, Jr.; Marvin Snyder

[57] ABSTRACT

A conductive film having low electrical resistance and having a high coefficient of transmission of radiation in the visible portion of the electromagnetic spectrum is described. The film consists of a thin layer of the intermetallic compound of gold and aluminum having the formula $AuAl_2$.

2 Claims, 6 Drawing Figures

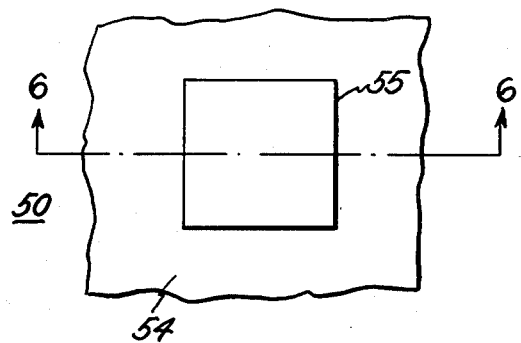
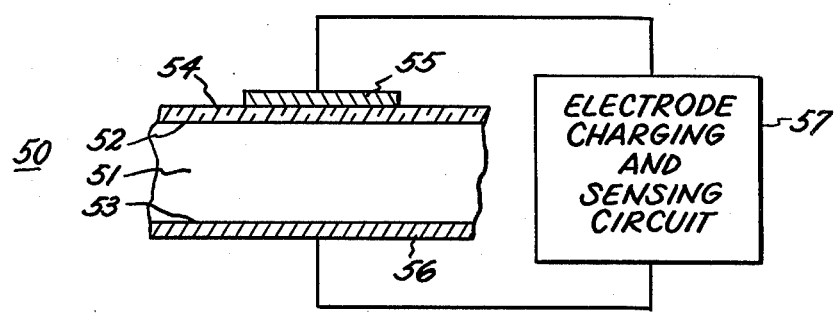

THIN FILMS OF LOW RESISTANCE AND HIGH COEFFICIENTS OF TRANSMISSION IN THE VISIBLE SPECTRUM

The present invention relates to the provision of thin films having low electrical resistance and having high coefficients of transmission in the visible portion of the electromagnetic spectrum.

Such films are useful in radiation sensing devices. A common form of radiation sensing device consists of a conductor insulatingly overlying a semiconductor substrate, referred to as a CIS capacitor. Such devices are incorporated in arrays of various kinds to form imagers for sensing images and providing electrical readout thereof. One such array is shown and described in U.S. Pat. No. 3,988,613. In such an array, high transparency or transmission of light waves as well as substantially uniform transmission thereof over the visible portion of the spectrum is desired in the electrodes of the devices. Also, in such an array, high electrical conductivity of the electrodes of the devices and the lines interconnecting the electrodes of the various devices is important particularly in arrays having a large number of devices to enable rapid scanning and sensing of received images and rapid readout thereof. Heretofore, various electrode materials have been utilized for the electrodes of the devices of the array and the lines interconnecting the electrodes of the devices of the array. One such commonly used material is heavily doped polycrystalline silicon. The use of polycrystalline silicon entails a compromise between high and uniform transparency and low resistance.

An object of the present invention is to provide thin films suitable for use in radiation sensing devices which have both high and substantially uniform transparency and low electrical resistance.

Another object of the present invention is to provide an improved radiation sensing device.

In accordance with the present invention a thin film is provided consisting of a thin layer of the compound of gold and aluminum having the formula $AuAl_2$. The thin layer has a thickness less than about 300 Angstroms. The resistivity of the compound of $AuAl_2$ is about $8 \times 10^{-6}$ ohm-cm., which is comparable to the resistivities of the metals nickel and tungsten and only about a factor of three above that of the metals gold and aluminum. For a thin film 100 Angstroms thick, the resistance per square is 8 ohms, and the coefficient of transmission in air is reasonably uniform over a major portion of the visible spectrum with a coefficient of transmission of 0.55 at a wavelength of 5500 Angstroms.

The novel features which are believed to be characteristic of the present invention are set forth with particularity in the appended claims. The invention itself, both as to its organization and method of operation, together with further objects and advantages thereof may best be understood by reference to the following description FIG. 1 shows graphs of the absorption coefficients of the intermetallic compound $AuAl_2$ and of various metallic elements.

FIG. 5 shows a plan view of a radiation sensing device embodying the present invention.

FIG. 6 shows sectional view of the device of FIG. 5 taken along section lines 5—5 of FIG. 5 showing the construction thereof and also shows an electrode charging and sensing circuit for the device.

Figure 1:
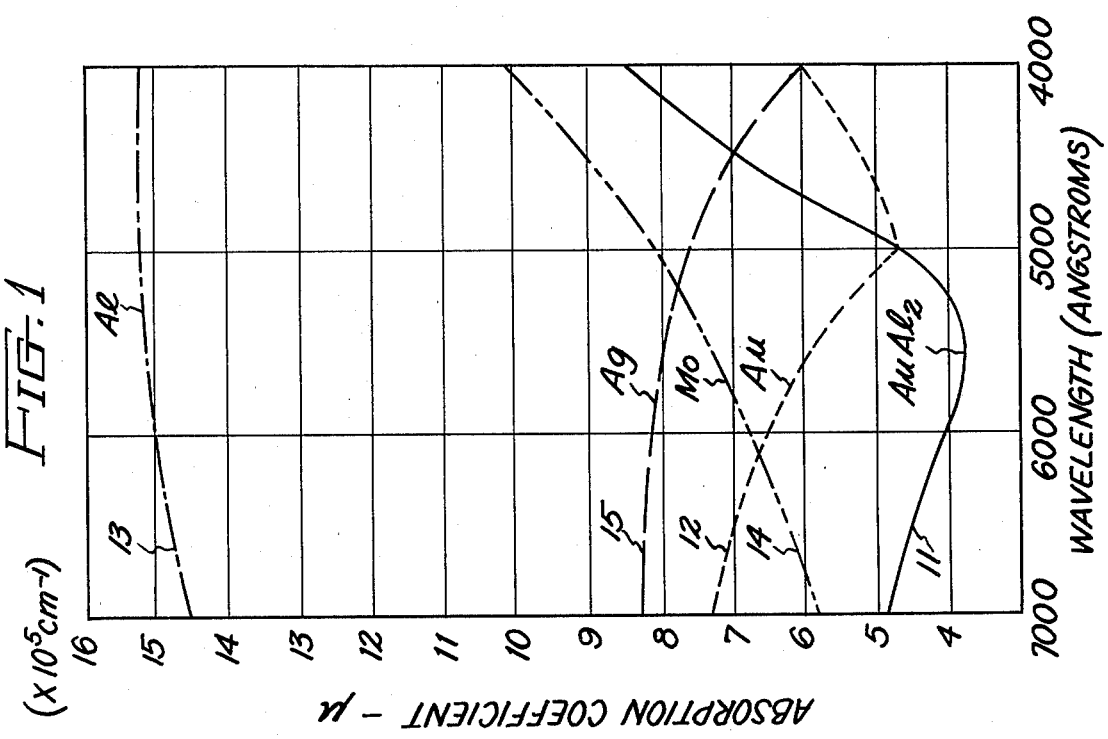

Reference is now made to FIG. 1 which shows graphs of the absorption coefficient of the intermetallic compound of $AuAl_2$ along with absorption coefficients for several elemental metals including gold, aluminum, silver and molybdenum. The graph 11 of the absorption coefficient for $AuAl_2$ was obtained by techniques well known to those skilled in the art by making a series of reflectivity measurements on a bulk piece of $AuAl_2$ in air as a function of wavelength and from these measurements using the Kramers-Kronig relations to obtain the optical constants of the material. The optical constants were then used to determine the absorption coefficient as a function of wavelength. Graphs 12, 13, 14 and 15 show the absorption coefficients for gold, aluminum, molybdenum and silver respectively as a function of wavelength. These values were taken from the literature and are based on measurements similar to the measurements described above in connection with the determination of the absorption coefficients of $AuAl_2$. The graphs of the absorption coefficients of $AuAl_2$ has a minimum value at 5500 Angstroms which is the peak sensitivity of the human eye to the visible portion of the spectrum and it is essentially uniform over the range from 5000 to 6000 Angstroms. The absorption coefficient of $AuAl_2$ over this range of wavelengths as well as beyond 6000 Angstroms is less than the absorption coefficient of gold and is very substantially less than the absorption coefficient of aluminum and also is substantially less than the absorption coefficients of molybdenum and silver. Thus, from an examination of the graphs of FIG. 1, it is apparent that the transmission properties of $AuAl_2$ are far superior to the transmission properties of molybdenum, silver and aluminum for a given thickness and is superior to the transmission properties of gold at wavelengths above 5000 Angstroms. Thus, $AuAl_2$ in the form of a thin film has a unique combination of characteristics. It has superior transmission characteristics, particularly in the range of wavelengths from 5000 to 6000 Angstroms, than the other metallic materials and in addition has a resistivity of $8 \times 10^{-6}$ ohm-cm., about three times the resistivity of gold or aluminum.

Figure 2:
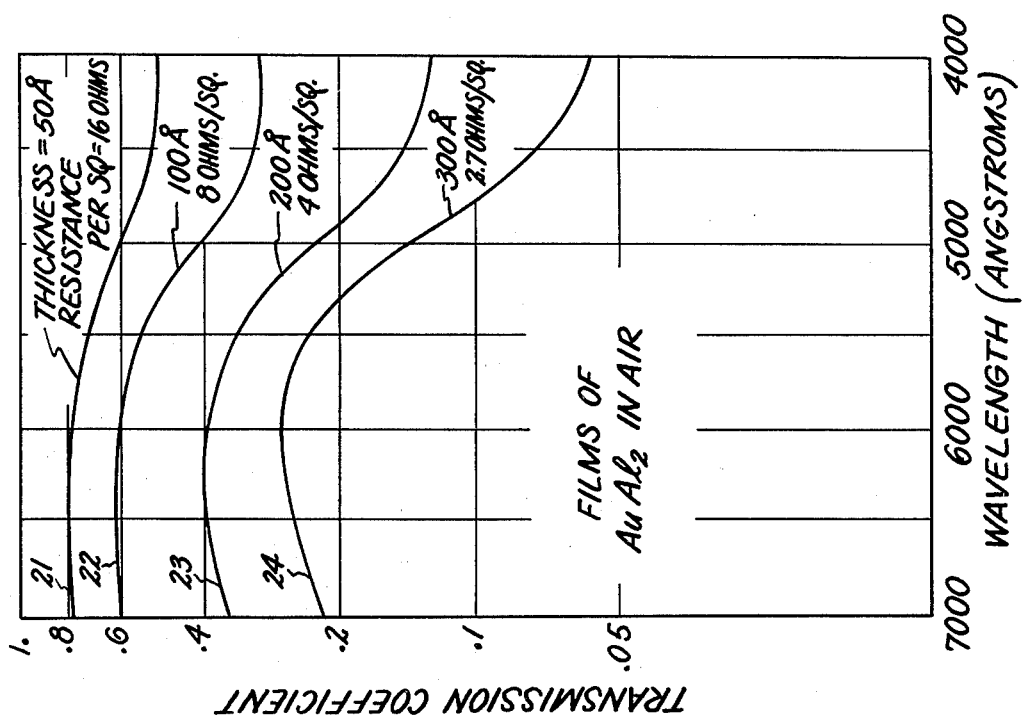
FIG. 2 shows graphs of the transmission coefficients as a function of wavelength for thin layers of $AuAl_2$ of various thicknesses in air.

Utilizing the absorption coefficients set forth in FIG. 1 for $AuAl_2$ the transmission coefficients of thin films of $AuAl_2$ were calculated for films of various thickness as to function of wavelength. The relationship utilized for determining the transmission coefficient is the following:

$$T = f(R_1, R_2) 3^{-\mu x}$$

where T is the transmission coefficient, $\mu$ is the absorption coefficient, x is the thickness of the film and the function f is a function of the reflectivity ($R_1$) of the incident surface and the reflectivity ($R_2$) of exit surface of the thin film. A transmission coefficient of 1 means that 100% of the radiation incident on the film is passed by the film. The transmission coefficient as a function of wavelength for $AuAl_2$ for various thicknesses thereof in air is set forth in FIG. 2. Graph 21, 22, 23 and 24 show the transmission coefficient for thickness of 50, 100, 200 and 300 Angstroms, respectively. Also set forth on these graphs are the resistances per square for the film. These values for films of thicknesses of 50, 100, 200 and 300 Angstroms are respectively 16 ohms per square, 8 ohms per square, 4 ohms per square, and 2.7 ohms per square. For a thickness of 50 Angstroms, the transmission of radiation of wavelengths over the range from 7000 to 4500 Angstroms is better than 60% and is substantially uniform. For greater thicknesses, the transmission percentage is reduced. For a film thickness of 200 Angstroms the transmission percentage of a wavelength of 6000 Angstroms is 40% and at a wavelength of 5000 Angstroms is 22%.

Figure 3:
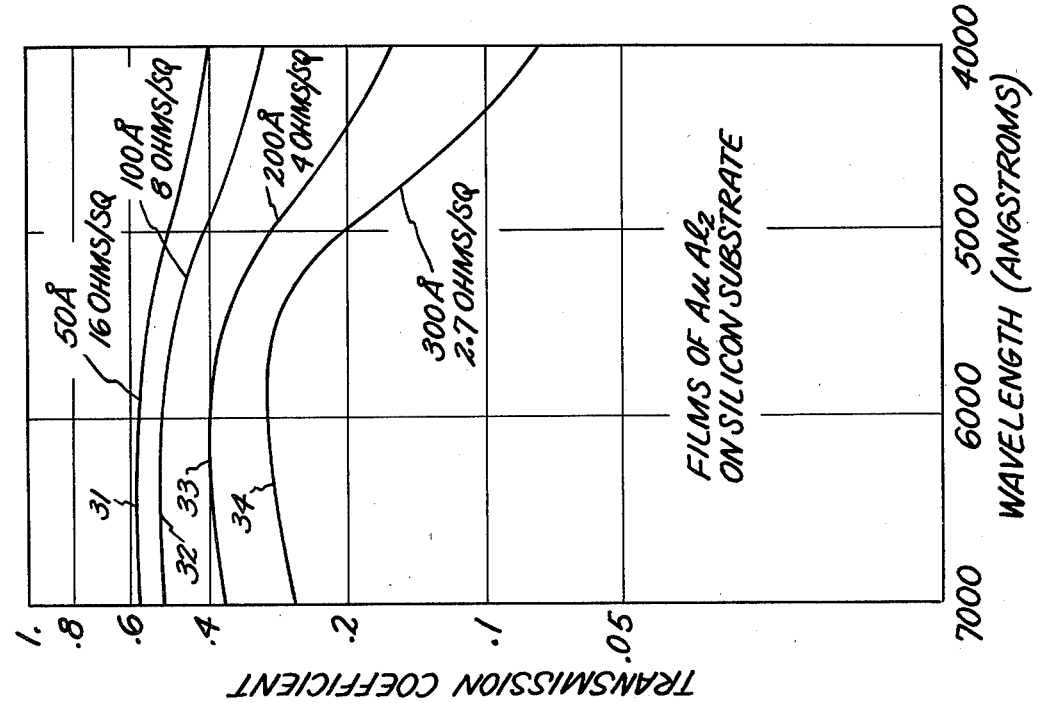
FIG. 3 shows graphs of the transmission coefficients as a function of wavelength for thin layers of $AuAl_2$ of various thicknesses on a silicon substrate.

FIG. 3 shows graphs of transmission coefficients of $AuAl_2$ for various thicknesses thereof on a silicon substrate. Graphs 31, 32, 33 and 34 show the transmission coefficients for films of thicknesses of 50, 100, 200, and 300 Angstroms, respectively. The graphs of FIG. 3 are generally of the same form as the graphs of FIG. 2. The differences in the graphs of FIGS. 2 and 3 for corresponding thicknesses are due to the differences in reflections at the exit surface of the thin films. The graph of the transmission coefficient of a thin film of $AuAl_2$ of a given thickness on another substrate, such as silicon dioxide or silicon nitride, is comparable to the transmission coefficient of $AuAl_2$ of the same thickness on silicon.

Figure 4:
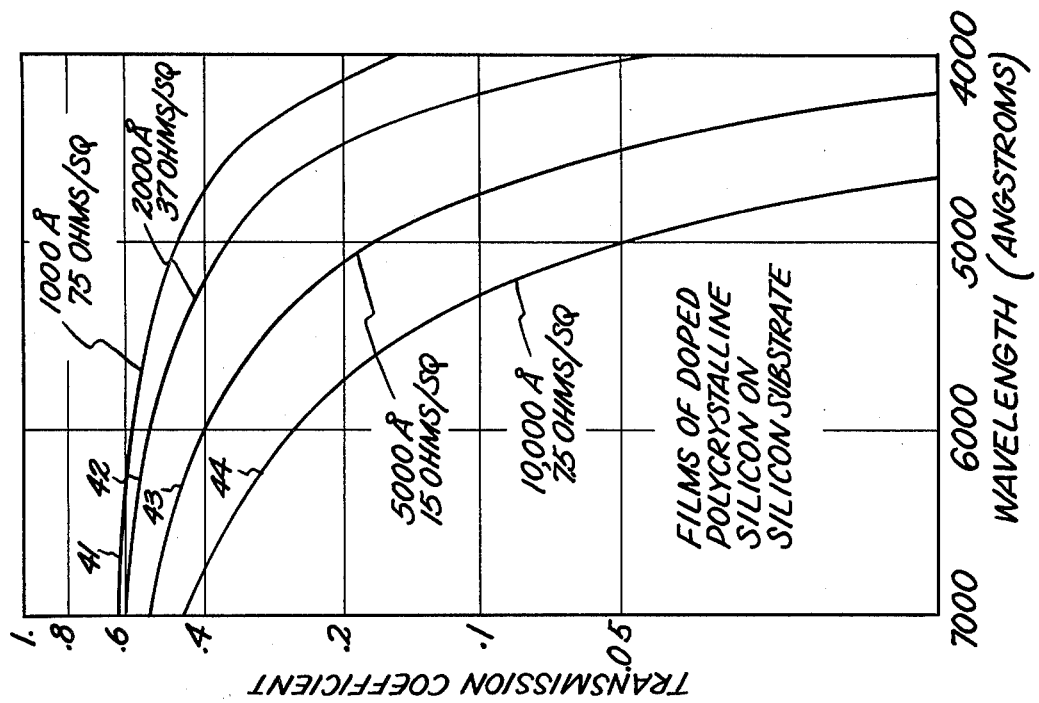
FIG. 4 shows graphs of the transmission coefficients as a function of wavelength for thin layers of polycrystalline silicon of various thicknesses on a silicon substrate.

Reference is now made to FIG. 4 which shows graphs of the coefficient of transmission as a function of wavelength of films or layers of polycrystalline silicon of various thicknesses deposited on a silicon substrate. Graphs 41, 42, 43 and 44 show the transmission coefficient for thicknesses of polycrystalline silicon of 1000, 2000, 5000 and 10,000 Angstroms, respectively. The layers of polycrystalline silicon have been very heavily doped to provide lowest resistivity obtainable. The resistance per square of the layers of thicknesses 1000, 2000, 5000 and 10,000 Angstroms are 75, 37, 15 and 7.5 ohms, respectively. The layer 1000 Angstroms thick has relatively high transmission coefficient and is relatively uniform over a wide range of the spectrum but drops off rapidly below 5000 Angstroms. The coefficient of transmission as a function of wavelength drops off even more rapidly with increased thickness of the layer of polycrystalline silicon.

From graph 42 of FIG. 4 and graph 32 of FIG. 3, it is apparent that a film of polycrystalline silicon 2000 Angstroms thick is somewhat comparable on the basis of transmission characteristics with a film of $AuAl_2$ 100 Angstroms thick except below 5000 Angstroms where $AuAl_2$ has better transmission characteristics. However, the resistance of 37 ohms per square of the polycrystalline film of graph 42 is over four times the resistance of 8 ohms per square of the $AuAl_2$ of graph 32. To obtain a resistance per square of the polycrystalline film of even the value of 37 ohms requires a thickness of 20 times the thickness of $AuAl_2$. To obtain a resistance per square in a film of polycrystalline silicon which is closer to the resistance per square of a film of 100 Angstroms of $AuAl_2$ requires a thickness of 10,000 Angstroms which has a resistance per square of 7.5 ohms. At this thickness the transmission characteristics are very seriously degraded as can be seen from graph 44 of FIG. 4. Thus, it is apparent that thin films of $AuAl_2$ are not only superior in respect to transmission characteristics and resistance per square, but also only relatively thin layers are required to achieve these results. The use of thin layers is an important requirement in high resolution devices.

The compound of $AuAl_2$ is readily formed by reacting gold and aluminum in a sealed evacuated enclosure at an elevated temperature. See "Electrical Properties of $AuAl_2$, $AuGa_2$, and $AuIn_2$" by J. P. Jan and W. B. Pearson in Philosophical Mag., Vol. 8, pg. 279, (1963). Also See "Expanded Contacts and Interconnections to Monolithic Silicon Integrated Circuits" by J. A. Cunningham, in Solid State Electronics, published by Pergamon Press, 1965, Vol. 8, pp. 735-745. $AuAl_2$ is a relatively stable material with a high melting temperature of 1060° C. $AuAl_2$ may be deposited in thin film form by evaporation or sputtering. $AuAl_2$ may be patterned using well known photolithographic masking and etching techniques.

Reference is now made to FIGS. 5 and 6 which show a radiation sensing device 50 in the form of conductor-insulator-semiconductor capacitor making use of a transparent conductor constituted of $AuAl_2$. The device comprises a substrate 51 of silicon semiconductor material having a pair of major surfaces 52 and 53 and conveniently 10 mils thick. The substrate 51 is of N-type conductivity and has a resistivity of 5 ohm-cm. A thin layer 54 of suitable insulating material such as silicon dioxide, for example, 1000 Angstroms thick is provided on one major surface 52 of the body. A conductive film or plate 55 of $AuAl_2$ 100 Angstroms thick, for example, is formed on the insulating layer 54 overlying the major surface 52 of the body and constitutes a first electrode of the device. Another film or plate 56 of suitable conductive material such as gold is secured to and makes ohmic contact with the other major surface 53 of the substrate and constitutes the second electrode of the device. Also shown is an electrode charging and sensing circuit 57 to which the electrodes 55 and 56 of the device 50 are connected. The electrode charging and sensing circuit 57 may consist of a source of unidirectional potential which biases the electrode 55 with respect to the base electrodes 54 to a negative voltage to form a depletion region thereof. Thereafter, the electrode 53 is allowed to float. After charge has been generated in the depletion region in response to radiation received therein through the electrode 55, the sensing circuit is connected across the electrodes 55 and 56 to obtain a measure of the charge generated therein and hence of the received radiation. A plurality of such devices are incorporated in the array of the aforementioned U.S. Pat. No. 3,988,613 which is incorporated herein by reference thereto. The manner in which the devices are interconnected and the manner in which the array is energized for sensing radiation and for the reading out of the sensed radiation is fully disclosed in the aforementioned U.S. Pat. No. 3,988,613.

I claim:

1. A radiation sensing device comprising
   a substrate of semiconductor material of one conductivity type, a first layer of transparent insulating material overlying a major surface of said substrate, a film of a conductive material overlying said first layer and forming a capacitor with said first layer, said film consisting of an intermetallic compound having the formula $AuAl_2$, said film being less than about 300 Angstroms thick,
   means for making conductive contact to said film,
   means for making conductive contact to said substrate.
2. The radiation sensing device of claim 1 in which said substrate is silicon and said transparent insulating layer is silicon dioxide.

* * * * *